(12) United States Patent
Jeong et al.

(10) Patent No.: US 7,596,049 B2
(45) Date of Patent: Sep. 29, 2009

(54) SEMICONDUCTOR MEMORY DEVICE WITH A PLURALITY OF BANK GROUPS EACH HAVING A PLURALITY OF BANKS SHARING A GLOBAL LINE GROUP

(75) Inventors: Young-Han Jeong, Kyoungki-do (KR); Seung-Bong Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 69 days.

(21) Appl. No.: 11/987,455

(22) Filed: Nov. 30, 2007

(65) Prior Publication Data

US 2008/0144404 A1 Jun. 19, 2008

(30) Foreign Application Priority Data

Nov. 30, 2006 (KR) ...................... 10-2006-0120100
Nov. 20, 2007 (KR) ...................... 10-2007-0118237

(51) Int. Cl.
*G11C 8/00* (2006.01)
(52) U.S. Cl. .............................. 365/230.03; 365/230.02
(58) Field of Classification Search ............ 365/230.03, 365/230.02
See application file for complete search history.

(56) References Cited

U.S. PATENT DOCUMENTS 6,163,863 A * 12/2000 Schicht ........................ 714/718
6,272,056 B1 * 8/2001 Ooishi ................... 365/189.18
6,961,273 B2 * 11/2005 Boldt et al. .................. 365/201
2001/0030896 A1 * 10/2001 Ooishi ........................ 365/200
2005/0152194 A1 * 7/2005 Boldt et al. .................. 365/201

FOREIGN PATENT DOCUMENTS

| KR | 100172383 B1 | 10/1998 |
|---|---|---|
| KR | 1020000062116 A | 10/2000 |
| KR | 1020010027370 A | 4/2001 |
| KR | 2006-0033431 A | 4/2006 |

OTHER PUBLICATIONS

Korean Notice of Preliminary Rejection, w/ English translation thereof, issued in Korean Patent Application No. 2007-0118237 dated on Nov. 26, 2008.
Notice of Allowance issued from Korean Intellectual Property Office on Mar. 5, 2009 with an English Translation.

* cited by examiner

*Primary Examiner*—Tuan T. Nguyen
(74) *Attorney, Agent, or Firm*—Mannava & Kang, P.C.

(57) ABSTRACT

The semiconductor memory device includes a plurality of bank groups each including a plurality of banks sharing one of a plurality of global input/output line groups, a data input unit configured to transfer external data to data input global lines in response to write commands corresponding to the respective bank groups, a data output unit configured to output data applied on data output global lines to an external circuit in response to read commands corresponding to the respective bank groups, and a data transfer unit configured to transfer data applied on the data input global lines to one of the plurality of global input/output line groups in response to the write commands, and to transfer data applied on one of the plurality of global input/output line groups to the data output global lines in response to the read commands.

8 Claims, 4 Drawing Sheets

SEMICONDUCTOR MEMORY DEVICE WITH A PLURALITY OF BANK GROUPS EACH HAVING A PLURALITY OF BANKS SHARING A GLOBAL LINE GROUP

CROSS-REFERENCE TO RELATED APPLICATIONS

The present invention claims priority to Korean patent application numbers 10-2006-0120100 and 10-2007-0118237, filed on Nov. 30, 2006 and Nov. 20, 2007 respectively, which is incorporated by reference in its entirety.

BACKGROUND OF THE INVENTION

The present invention relates to a semiconductor memory device, and more particularly to a semiconductor memory device with a plurality of bank groups each having a plurality of banks sharing a global line group.

Generally, a semiconductor memory device is used for storing data and outputting desired data among the stored data. In other words, the operations of the semiconductor memory device include a write operation of storing data inputted from an external circuit and a read operation of outputting a stored data to an external circuit.

Generally, semiconductor memory devices such as a Dynamic random access memory (DRAM), one of volatile memory devices, use a memory cell for storing data. The semiconductor memory devices perform a sequence of operations such as an active operation, a read/write operation, and a precharge operation to store external data in the memory cell or output a stored data to an external circuit.

The active operation and the read/write operation are to select a designated cell from a plurality of DRAM cells and output a data stored in the selected cell or stores an external data therein. The precharge operation is to reset the DRAM to a state prior to the active operation.

Therefore, the semiconductor memory device must ensure time margins for the active operation, the read/write operation and the precharge operation so as to output the stored data or store the external data one time.

The semiconductor memory device includes a plurality of banks each being defined by grouping a plurality of cells. In order for more efficient data input/output operations, the banks are configured to independently input/output data.

FIG. 1 is block diagram of a conventional semiconductor memory device with a plurality of banks.

Referring to FIG. 1, the conventional semiconductor memory device includes a plurality of banks BANK0, BANK1, BANK2 and BANK3, a plurality of global input/output (I/O) lines GIO, a data input unit 130, and a data output unit 150. The banks BANK0, BANK1, BANK2 and BANK3 share the global I/O lines GIO and input and output data therethrough. The data input unit 130 transfers external data INPUT_DATA to the global I/O lines GIO, and the data output unit 150 outputs data IN_DATA applied on the global I/O lines GIO to an external circuit.

In such a semiconductor memory device, when one bank performs a read or write operation after an active operation, another bank performs an active operation and other bank performs a precharge operation. In this way, the banks perform the active operation, the read or write operation, and the precharge operation in turn.

In view of the data input/output timing between the semiconductor memory device and external circuits, data can be successively inputted or outputted in predetermined intervals. Thus, the data can be inputted or outputted at higher speed, compared with data of a semiconductor memory device that do not use the banks.

However, the data input/output operation using the banks needs a waiting time for the following reasons.

For example, in order to output data stored in the bank BANK0 to an external circuit, data stored at positions designated in the bank BANK0 are transferred to the global I/O lines GIO through the read operation and then are outputted through the data output unit 150 to the external circuit.

On the contrary, in order to store external data in the bank BANK0, the external data are transferred through the data input unit 130 to the global I/O lines GIO and then are stored in positions designated in the bank BANK0 through the write operation.

That is, in the read or write operation, data always pass through the data input unit 130, the data output unit 150, and the global I/O lines GIO.

Such a read or write operation is also applied on the first to third banks BANK1, BANK2 and BANK3. That is, in the read or write operation of the first to third banks BANK1, BANK2 and BANK3, data pass through the data input unit 130, the data output unit 150, and the global I/O lines GIO. Consequently, when one bank performs the read or write operation, the remaining banks cannot perform the read or write operation.

To solve the problem, a semiconductor memory device with a following modified structure was proposed.

FIG. 2 is a block diagram of a conventional semiconductor memory device with a plurality of bank groups.

Referring to FIG. 2, the conventional semiconductor memory device includes a plurality of bank groups GROUP_0, GROUP_1, GROUP_2 and GROUP_3, a data input unit 220, a data output unit 240, data transfer units 280 and 290. Each of the bank groups GROUP_0, GROUP_1, GROUP_2 and GROUP_3 includes a plurality of banks BANK0, BANK1, BANK2 and BANK3. The banks BANK0, BANK1, BANK2 and BANK3 share one of global I/O line groups GIO_GRP0, GIO_GRP1, GIO_GRP2 and GIO_GRP3. The data input unit 220 transfers external data INPUT_DATA to data input global lines GIOW<0:1> and GIOW<2:3> in response to write commands WR_CMD<0:3> corresponding to the bank groups GROUP_0, GROUP_1, GROUP_2 and GROUP_3. The data output unit 240 outputs data applied on data output global lines GIOR<0:1> and GIOR<2:3> to an external circuit in response to read commands RD_CMD<0:3> corresponding to the bank groups GROUP_0, GROUP_1, GROUP_2 and GROUP_3. The data transfer units 280 and 290 transfer data applied on the global I/O line groups GIO_GRP0, GIO_GRP1, GIO_GRP2 and GIO_GRP3 to the data input global lines GIOW<0:1> and GIOW<2:3> or transfers data applied on the data output global lines GIOR<0:1> and GIOR<2:3> to the global I/O line groups GIO_GRP0, GIO_GRP1, GROUP_2 and GROUP_3. The semiconductor memory device may further include a command decoding unit 260 configured to decode external commands CMD and addresses ADDR to generate the write commands WR_CMD<0:3> and the read commands RD_CMD<0:3>.

An operation of the conventional semiconductor memory device with the plurality of bank groups GROUP_0, GROUP_1, GROUP_2 and GROUP_3 will be described below.

The global I/O line group GIO_GRP0, GIO_GRP1, GIO_GRP2 and GIO_GRP3, the independent data input global lines GIOW<0:1> and GIOW<2:3>, and the independent data output global lines GIOR<0:1> and GIOR<2:3> can be independently provided for an input or an output operation in the respective bank groups GROUP_0, GROUP_1, GROUP_2 and GROUP_3. Thus, the data can be immediately inputted or outputted at the substantially same time when the bank groups GROUP_0, GROUP_1, GROUP2 and GROUP_3 are all enabled. The substantially same time means 1 tCK, i.e., one period of a system clock (CLK), representing a minimum time interval necessary for the input of the external address to activate one bank group When one of the bank groups is enabled, one of the plurality of banks BANK0, BANK1, BANK2 and BANK3 provided within the enabled bank group is enabled to output the data to the external circuit or store the external data.

Since the plurality of banks BANK0, BANK1, BANK2 and BANK3 within the bank groups GROUP_0, GROUP_1, GROUP_2 and GROUP3 can perform the active operation, the read/write operations, and the precharge operation in turn, the data can be immediately inputted or outputted even though a plurality of banks each included in one of the bank groups GROUP_0, GROUP_1, GROUP_2 and GROUP_3 are successively enabled at the substantially same time.

However, the line number of each of the global I/O line groups GIO_GRP0, GIO_GRP1, GIO_GRP2 and GIO_GRP3 is 64, the number of each of the data input global lines GIOW<0:1> and GIOW<2:3> is 128, and the number of each of the data output global lines GIOR<0:1> and GIOR<2:3> is 128. That is, in order for the bank groups GROUP_0, GROUP_1, GROUP_2 and GROUP_3 to perform data I/O operations independently, the group global I/O lines GIO_GRP0, GIO_GRP1, GIO_GRP2 and GIO_GRP3, the data input global lines GIOW<0:1> and GIOW<2:3>, and the data output global lines GIOR<0:1> are connected to one another in one-to-one way.

Such a configuration having two times the number of lines increases an area of the semiconductor memory device.

SUMMARY OF THE INVENTION

Embodiments of the present invention are directed to providing a semiconductor memory device with a plurality of bank groups each having a plurality of banks sharing a global line group, which can reduce the number of data I/O global lines by making the bank groups share data I/O global lines.

Accordingly, the area occupied by the data I/O global lines in the semiconductor memory device is reduced, thereby preventing the increase in an entire area of the semiconductor memory device.

In accordance with an aspect of the present invention, there is provided a semiconductor memory device including a plurality of bank groups each including a plurality of banks sharing one of a plurality of global input/output line groups, a data input unit configured to transfer external data to data input global lines in response to write commands corresponding to the respective bank groups, and a data multiplexing unit configured to transfer data applied on the data input global lines to one of the plurality of global input/output line groups in response to the write commands.

In accordance with another aspect of the present invention, there is provided a semiconductor memory device including a plurality of bank groups each including a plurality of banks sharing one of a plurality of global input/output line groups, a data output unit configured to output data applied on data output global lines to an external circuit in response to read commands corresponding to the respective bank groups, and a data demultiplexing unit configured to transfer data applied on one of the plurality of global input/output line groups to the data output global lines in response to the read commands.

In accordance with further aspect of the present invention, there is provided a semiconductor memory device including a plurality of band groups each including a plurality of banks sharing one of a plurality of global input/output line groups, a data input unit configured to transfer external data to data input global lines in response to write commands corresponding to the respective bank groups, a data output unit configured to output data applied on data output global lines to an external circuit in response to read commands corresponding to the respective bank groups, and a data transfer unit configured to transfer data applied on the data input global lines to one of the plurality of global input/output line groups in response to the write commands, and to transfer data applied on one of the plurality of global input/output line groups to the data output global lines in response to the read commands.

DESCRIPTION OF SPECIFIC EMBODIMENTS

Hereinafter, a semiconductor memory device in accordance with the present invention will be described in detail with reference to the accompanying drawings.

Figure 3:
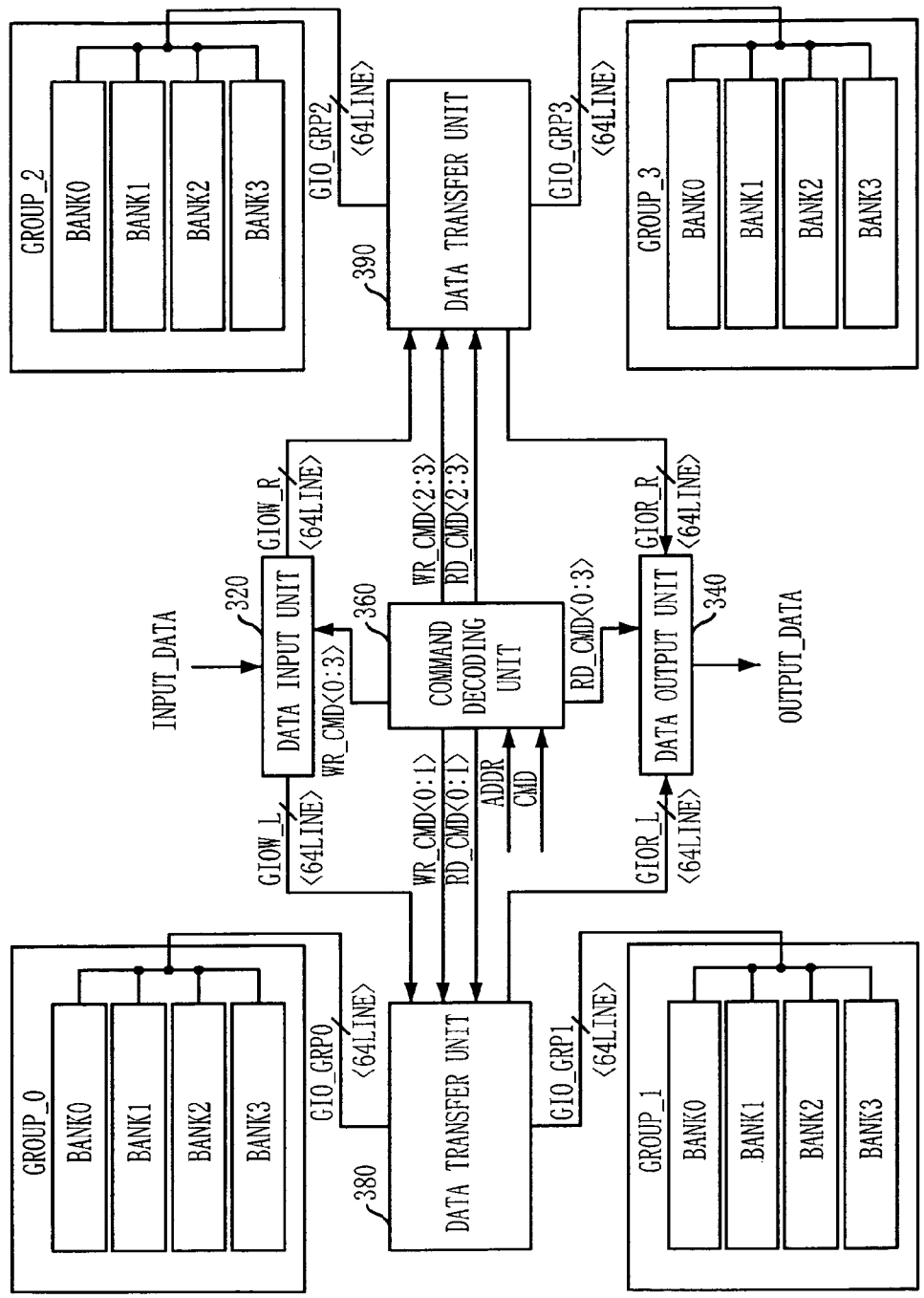
FIG. 3 is a block diagram of a semiconductor memory device with a plurality of bank groups in accordance with an embodiment of the present invention.

FIG. 3 is a block diagram of a semiconductor memory device with a plurality of bank groups in accordance with an embodiment of the present invention.

Referring to FIG. 3, the semiconductor memory device includes a plurality of bank groups GROUP_0, GROUP_1, GROUP_2 and GROUP_3, a data input unit 320, a data output unit 340, data transfer units 380 and 390. Each of the bank groups GROUP_0, GROUP_1, GROUP_2 and GROUP_3 includes a plurality of banks BANK0, BANK1, BANK2 and BANK3. The banks BANK0, BANK1, BANK2 and BANK3 share one of global I/O line groups GIO_GRP0, GIO_GRP1, GIO_GRP2 and GIO_GRP3. The data input unit 320 transfers external data INPUT_DATA to data input global lines GIOW_L and GIOW_R in response to write commands WR_CMD<0:3> corresponding to the bank groups GROUP_0, GROUP_1, GROUP_2 and GROUP_3. The data output unit 340 outputs data applied on output global lines GIOR_L and GIOR_R to an external circuit in response to read commands RD_CMD<0:3> corresponding to the bank groups GROUP_0, GROUP_1, GROUP_2 and GROUP_3. The data transfer units 380 and 390 transfer data applied on the data input global lines GIOW_L and GIOW_R to one of the global I/O line groups GIO_GRP0, GIO_GRP1, GIO_GRP2 and GIO_GRP3 in response to the write commands WR_CMD<0:3>, and transfer data applied on one of the global I/O line groups GIO_GRP0, GIO_GRP1, GIO_GRP2 and GIO_GRP3 to the data output global lines GIOR_L and GIOR_R in response to the read commands RD_CMD<0:3>. The semiconductor memory device may further include a command decoding unit 360 configured to decode external commands CMD and addresses ADDR to generate the write commands WR_CMD<0:3> and the read commands RD_CMD<0:3>.

Figure 4:
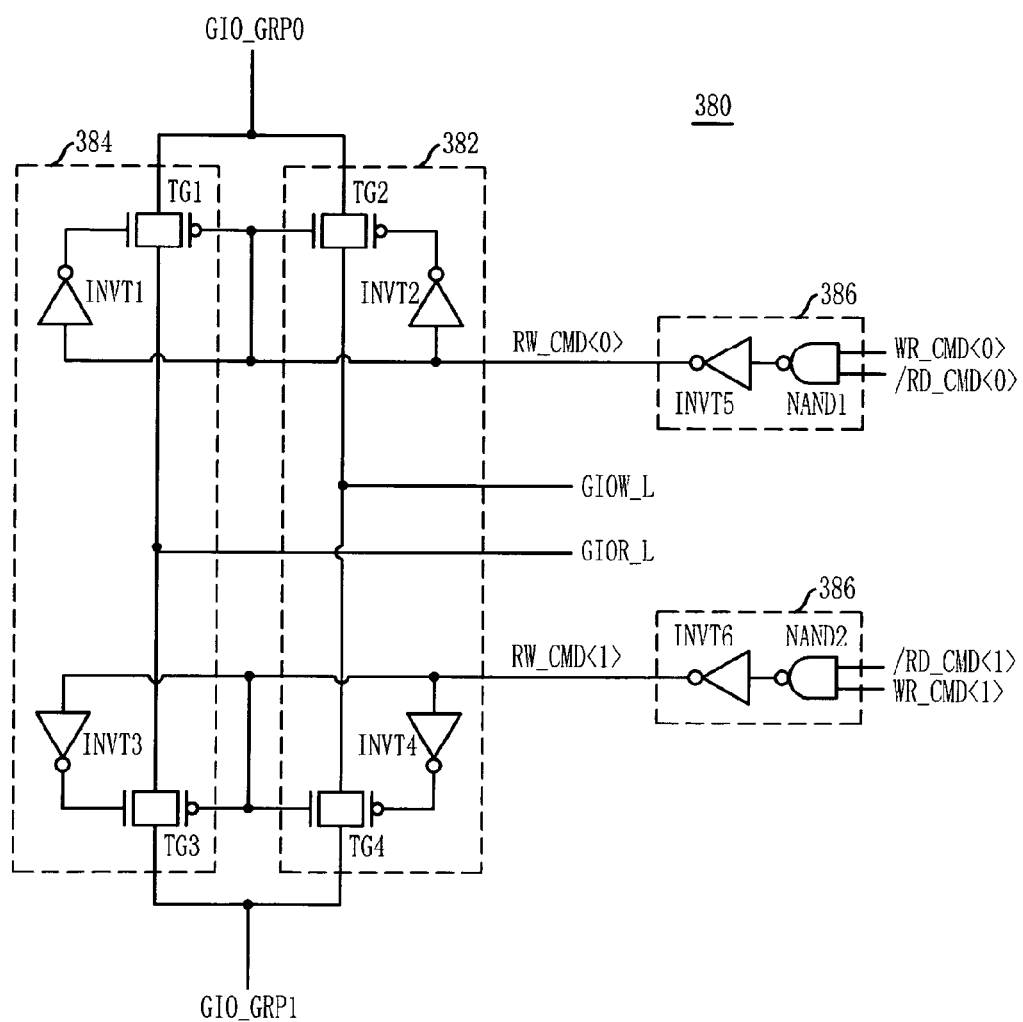
FIG. 4 is a circuit diagram of a data transfer unit of FIG. 3.

FIG. 4 is a circuit diagram of the data transfer unit of FIG. 3. Specifically, the data transfer unit 380 for the bank groups GROUP_0 and GROUP_1 is illustrated in FIG. 4.

Referring to FIG. 4, the data transfer unit 380 includes a data multiplexing unit 382 and a data demultiplexing unit 384. The data multiplexing unit 382 transfers data applied on data input global lines GLOW, i.e., a reference GIOW_L of FIG. 3, to one of the global I/O line groups GIO_GRP0 and GIO_GRP1 in response to the write commands WR_CMD<0> and WR_CMD<1>. The demultiplexing unit 384 transfers data applied on one of the global I/O line groups GIO_GRP0 and GIO_GRP1 to the data output global lines GIOR, i.e., a reference GIOR_L of FIG. 3, in response to the read commands RD_CMD<0> and RD_CMD<1>. In addition, the data transfer unit 380 further includes a first signal generating unit 386 and a second signal generating unit 388. The first signal generating unit 386 generates a first connection control signal RW_CMD<0> for controlling the connection between the global I/O line group GIO_GRP0 and the data output global lines GIOR or the data input global lines GIOW in response to the write command WR_CMD<0> and an inverted signal /RD_CMD<0> of the read command RD_CMD<0>. The second signal generating unit 388 generates a second connection control signal RW_CMD<1> for controlling the connection between the global I/O line group GIO_GRP1 and the data output global lines GIOR or the data input global lines GIOW in response to the write command WR_CMD<1> and an inverted signal /RD_CMD<1> of the read command RD_CMD<1>.

The data multiplexing unit 382 includes a first inverter INVT2, a first transfer gate TG2, a second inverter INVT4, and a second transfer gate TG4. The first inverter INVT2 is configured to invert the first connection control signal RW_CMD<0>. The first transfer gate TG2 is configured to control the connection of the global I/O line group GIO_GRP0 to the data input global lines GIOW in response to the first connection control signal RW_CMD<0> and an output signal of the first inverter INVT2. The second inverter INVT4 is configured to invert the second connection control signal RW_CMD<1>. The second transfer gate TG4 is configured to control the connection of the global I/O line group GIO_GRP1 to the data input global lines GIOW in response to the second connection control signal RW_CMD<1> and an output signal of the second inverter INVT4.

The data demultiplexing unit 384 includes a third inverter INVT1, a third transfer gate TG1, a fourth inverter INVT3, and a fourth transfer gate TG3. The third inverter INVT1 is configured to invert the first connection control signal RW_CMD<0>. The third transfer gate TG1 is configured to control the connection of the global I/O line group GIO_GRP0 to the data output global lines GIOR in response to the first connection control signal RW_CMD<0> and an output signal of the third inverter INVT1. The fourth inverter INVT3 is configured to invert the second connection control signal RW_CMD<1>. The fourth transfer gate TG3 is configured to control the connection of the global I/O line group GIO_GRP1 to the data output global lines GIOR in response to the second connection control signal RW_CMD<1> and an output signal of the fourth inverter INVT3.

The first signal generating unit 386 includes a NAND gate NAND1 configured to receive the write command WR_CMD<0> and the inverted signal /RD_CMD<0> of the read command RD_CMD<0>, and an inverter INVT5 configured to invert an output signal of the NAND gate NAND1 to output the first connection control signal RW_CMD<0>.

The second signal generating unit 388 includes a NAND gate NAND2 configured to receive the write command WR_CMD<1> and the inverted signal /RD_CMD<1> of the read command RD_CMD<1>, and an inverter INVT6 configured to invert an output signal of the NAND gate NAND2 to output the second connection control signal RW_CMD<1>.

An operation of the semiconductor memory device with the plurality of bank groups GROUP_0 GROUP_1, GROUP_2 and GROUP_3 will be described below.

Figure 1:
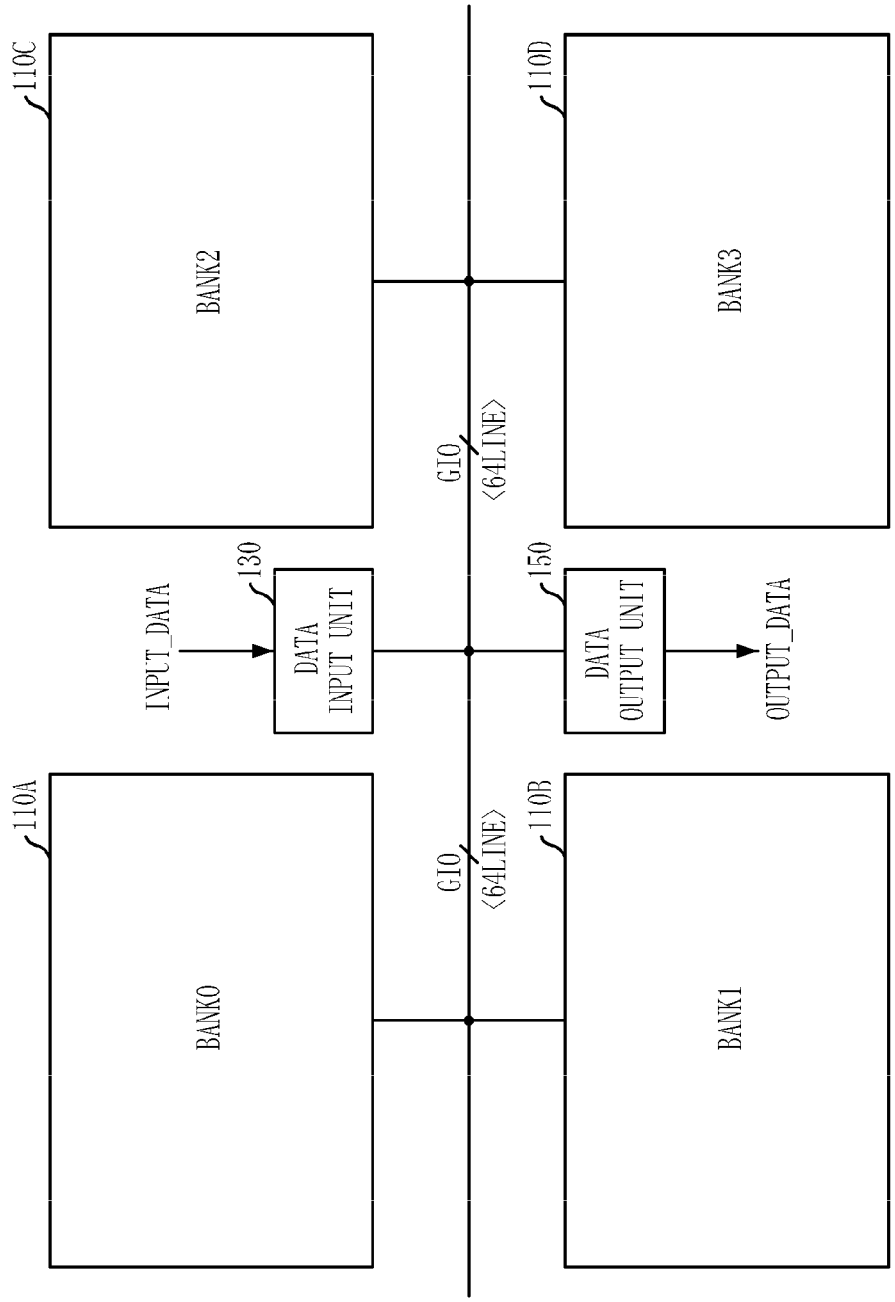
FIG. 1 is block diagram of a conventional semiconductor memory device with a plurality of banks.
Figure 2:
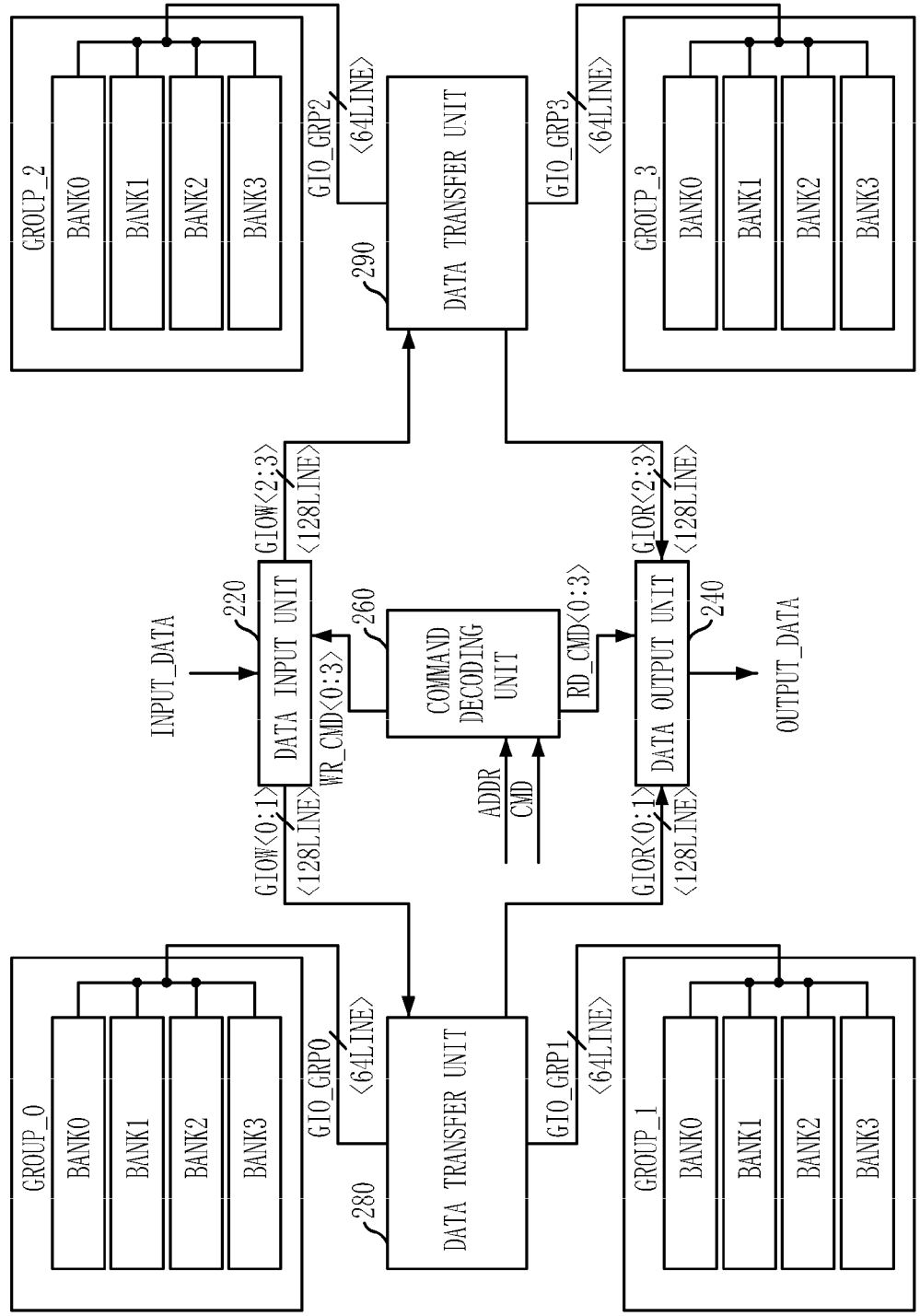
FIG. 2 is a block diagram of a conventional semiconductor memory device with a plurality of bank groups.

Compared with the conventional semiconductor memory device of FIG. 2, the number of the data input global lines GIOW_L and GIOW_R and the number of the data output global lines GIOR_L and GIOR_R are reduced to 64. Further, the write commands WR_CMD<0:3> and the read commands RD_CMD<0:3> generated by the command decoding unit 360 are directly applied to the data transfer units 380 and 390.

The write commands WR_CMD<0:3> and the read commands RD_CMD<0:3> are signals corresponding to the plurality of bank groups GROUP_0, GROUP_1, GROUP_2 and GROUP_3. For example, the read command RD_CMD<0> is enabled when the data stored in the bank group GROUP_0 is outputted to the external circuit. The write command WR_CMD<3> is enabled when the external data is stored in the bank group GROUP_3.

Since the write commands WR_CMD<0:3> and the read commands RD_CMD<0:3> are directly applied to the data transfer units 380 and 390, it is possible to exactly know which bank group of the bank groups GROUP_0, GROUP_1, GROUP_2 and GROUP_3 performs the read operation or the write operation.

Therefore, the data transfer units 380 and 390 can independently control the on/off operation of the global I/O line groups GIO_GRP0, GIO_GRP1, GIO_GRP2 and GIO_GRP3 corresponding to the bank groups GROUP_0, GROUP_1, GROUP_2 and GROUP_3.

When the read command RD_CMD<0> is enabled, only the data output global lines GIOW_L and the global I/O line group GIO_GRP0 of the bank group GROUP_0 are connected. In this case, since the read command RD_CMD<1> is in a disabled state, the global I/O line group GIO_GRP1 of the bank group GROUP_1 adjacent to the bank group GROUP_0 are not connected to the data output global lines GIOW_L.

Even though the number of the data input global lines GIOW_L and GIOW_R and the number of the data output global lines GIOR_L and GIOR_R are reduced, the use of the write commands WR_CMD<0:3> and the read commands RD_CMD<0:3> applied to the data transfer units makes it possible for the plurality of bank groups GROUP_0, GROUP_1, GROUP_2 and GROUP_3 to share the data input global lines GIOW_L and GIOW_R and the data output global lines GIOR_L and GIOR_R. Thus, the semiconductor memory device of FIG. 3 can be implemented to operate in the same manner as the semiconductor memory device having the plurality of bank groups GROUP_0, GROUP_1, GROUP_2 and GROUP_3 shown in FIG. 2.

In the semiconductor memory device of the present invention, the bank groups GROUP_0, GROUP_1, GROUP_2 and GROUP_3 having the independent global I/O line groups GIO_GRP0, GIO_GRP1, GIO_GRP2 and GIO_GRP3 respectively can share the data output global lines GIOW_L and GIOW_R and the data input global lines GIOR_L and GIOR_R by using the write commands WR_CMD<0:3> and the read commands RD_CMD<0:3> corresponding to the bank groups GROUP_0, GROUP_1, GROUP_2 and GROUP_3, thereby preventing the increase in the number of the data output global lines GIOW_L and GIOW_R and the number of the data input global lines GIOR_L and the GIOR_R.

Consequently, the area occupied by the data output global lines GIOW_L and GIOW_R and the data input global lines GIOR_L and GIOR_R in the semiconductor memory device is reduced, thereby preventing the increase of the entire area of the semiconductor memory device.

Although it has been described in the above embodiments of the present invention that the semiconductor memory device includes four bank groups each having four banks, the number of the bank groups and the number of the banks can be changed. In addition, positions and types of logic gates and transistors of the above-described embodiments may vary depending on polarity of input signals While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a plurality of bank groups each including a plurality of banks sharing one of a plurality of global input/output line groups;
   a data input unit configured to transfer external data to data input global lines in response to write commands corresponding to the respective bank groups; and
   a data multiplexing unit configured to transfer data applied on the data input global lines to one of the plurality of global input/output line groups in response to the write commands.

2. The semiconductor memory device as recited in claim 1, further comprising a command decoding unit configured to decode external commands and addresses to generate the write commands.

3. A semiconductor memory device, comprising:
   a plurality of bank groups each including a plurality of banks sharing one of a plurality of global input/output line groups;
   a data output unit configured to output data applied on data output global lines to an external circuit in response to read commands corresponding to the respective bank groups; and
   a data demultiplexing unit configured to transfer data applied on one of the plurality of global input/output line groups to the data output global lines in response to the read commands.

4. The semiconductor memory device as recited in claim 3, further comprising a command decoding unit configured to decode external commands and addresses to generate the read commands.

5. A semiconductor memory device, comprising:
   a plurality of bank groups each including a plurality of banks sharing one of a plurality of global input/output line groups;
   a data input unit configured to transfer external data to data input global lines in response to write commands corresponding to the respective bank groups;
   a data output unit configured to output data applied on data output global lines to an external circuit in response to read commands corresponding to the respective bank groups; and
   a data transfer unit configured to transfer data applied on the data input global lines to one of the plurality of global input/output line groups in response to the write commands, and to transfer data applied on one of the plurality of global input/output line groups to the data output global lines in response to the read commands.

6. The semiconductor memory device as recited in claim 5, further comprising a command decoding unit configured to decode external commands and addresses to generate the read commands and the write commands.

7. The semiconductor memory device as recited in claim 5, wherein the data transfer unit includes:
   a transfer control signal generating unit configured to generate a transfer control signal in response to the write commands and the read commands;
   a data multiplexing unit configured to transfer the data applied on the data input global lines to one of the plurality of global input/output line groups in response to the transfer control signal; and
   a data demultiplexing unit configured to transfer the data applied on one of the plurality of global input/output line groups to the data output global lines in response to the transfer control signal.

8. The semiconductor memory device as recited in claim 5, further comprising:
   a data input pad coupled to the data input unit and configured to transfer the external data to the data input unit; and
   a data output pad coupled to the data output unit and configured to output the data applied on the data output unit to the external circuit.

* * * * *